United States Patent [19]
Roach

[11] Patent Number: 5,512,838
[45] Date of Patent: Apr. 30, 1996

[54] PROBE WITH REDUCED INPUT CAPACITANCE

[75] Inventor: Steven D. Roach, Colorado Springs, Colo.

[73] Assignee: Hewlett-Packard Company, Palo Alto, Calif.

[21] Appl. No.: 940,128

[22] Filed: Sep. 3, 1992

[51] Int. Cl.⁶ .................................................. G01R 1/06
[52] U.S. Cl. ........................ 324/754; 324/72.5; 324/149
[58] Field of Search ............................ 324/158 P, 158 F, 324/72.5, 149, 123 R, 126, 127, 754, 750, 158.1; 333/81 A, 248, 247; 439/482

[56] References Cited

U.S. PATENT DOCUMENTS

| | | | |
|---|---|---|---|
| 1,253,212 | 1/1918 | Chubb | 324/126 |
| 1,617,912 | 2/1927 | Kafka et al. | 324/126 |
| 1,795,207 | 3/1931 | Frick | 324/126 |
| 1,810,063 | 6/1931 | Thomas | 324/126 |
| 2,882,597 | 4/1959 | Miller | 324/149 |
| 3,412,327 | 11/1968 | Murray | 324/72.5 |
| 3,444,465 | 5/1969 | Teixeika | 324/72.5 |
| 3,532,982 | 10/1970 | Zeidlhack et al. | 324/72.5 |
| 4,318,042 | 3/1982 | Eda et al. | 324/158 P |
| 4,394,617 | 7/1983 | Wampler | 324/149 |
| 4,646,005 | 2/1987 | Ryan | 324/158 P |
| 4,764,722 | 8/1988 | Coughlin et al. | 324/72.5 |
| 5,172,051 | 12/1992 | Zamborelli | 324/72.5 |

OTHER PUBLICATIONS

Jim Williams, *High Speed Amplifier Techniques*, Linear Technology AN47–1, Aug. 1991, United States.

Walters, et al., *Probing techiques become crucial above 500 Mhz*, Electronics Design News, Oct. 15, 1987, pp. 165–174, United States.

*Primary Examiner*—Vinh P. Nguyen

[57] ABSTRACT

A test probe includes a probe tip electrically connected to a probe amplifier. The probe tip includes an input conductor, a shield conductor, and a middle conductor between the input conductor and the shield. The capacitance between the middle conductor and the input conductor are employed in a frequency compensation circuit. In one embodiment the three conductors form a triaxial probe tip. The middle conductor is a thin film formed along an equipotential surface defined between the input conductor and the shield with the middle conductor not present.

18 Claims, 10 Drawing Sheets

PROBE WITH REDUCED INPUT CAPACITANCE

BACKGROUND OF THE INVENTION

1. Field of the Invention

The invention in general relates to electrical test probes, and more particularly to an improved probe tip structure which reduces the input capacitance of the probe.

2. Statement of the Problem

Electrical test probes are often used to connect electrical circuits to test instruments, such as oscilloscopes or voltmeters, while minimizing the loading of the circuit under test. Two desirable electrical characteristics of an electrical test probe are; first, the probe should not influence or "load" the response of the circuit under test; and secondly, that the signal response at the test instrument should be an accurate, though possibly attenuated, representation of the probed signal over the range of frequencies of interest; that is, the signal on the output of the test probe follows the signal at its input. Generally, the first characteristic is accomplished by making the impedance at the probe input as high as possible to prevent the test probe and instrument to which it is connected from drawing significant current or otherwise significantly altering the electrical parameters on the node to be tested. The impedance at the output is generally a value that meets the impedance needs of typical test instruments. Thus test probes may be thought of as essentially impedance buffers. Some probes, generally called divider probes, may also attenuate the voltage of the circuit under test and decrease the capacitance and increase the resistance presented to the circuit by an attenuation factor. For example, a probe with an attenuation factor of 10 will reduce the voltage of the input signal, reduce the input capacitance of the probe, and increase the resistance of the probe by a factor of 10. This invention will be implemented in terms of a passive divider probe; however, it is applicable to active divider probes and other probes in general.

The accomplishment of the second characteristic, the accurate reproduction of the signal, is usually more complicated. Frequencies of electrical signals that a test probe are called on to transmit to a test instrument can vary from zero, in the case of DC signals, to the gigahertz range, in the case of extremely fast digital circuits. Thus it is essential that test probes have a response that is flat to a high degree of accuracy across a wide range of frequencies or band width. However, the capacitance of the probe connecting cable and the probe amplifier circuit interacts with the voltage divider resistors in the probe, limiting the possible bandwidth. Thus most test probes include a frequency compensation circuit near the probe tip which compensates for the capacitance of the probe cable and amplifier and thus broadens the band width. This compensation circuit usually includes a compensation capacitor, which is difficult to miniaturize. See for example U.S. Pat. No. 5,172,051 issued Dec. 15, 1992, on an invention of Thomas J. Zamborelli.

It is not physically possible to locate the compensation circuit at the very end of the probe tip that contacts the circuit to be tested. Thus, there is always a portion of the probe tip and attached probe tip lead that exhibits stray capacitance to grounded portions of the probe tip, especially the shield that is often present. The stray capacitance of this portion of the circuit will be seen entirely by the circuit under test. This capacitance will not be reduced by the attenuation factor. Thus it is critical to minimize the stray portion of a test probe circuit.

Current trends toward miniaturization in integrated circuit packaging, multiplication of leads on integrated circuits, and increased signal speeds tend to aggravate the problem of stray capacitance. As the number of chip leads increases, it becomes necessary to utilize probes with multiple probe tips, so as to provide the possibility of multiplexing test signals and/or simultaneous testing of several leads at once. As lead spacings in integrated circuits shrink, the tips of multiple tip test probes are forced closer together, and it becomes increasingly difficult to locate the compensation circuits, particularly the compensation capacitors, near the probe tips. Though not to the same extent as for multiple tip probes, this phenomenon also affects single tip probes since large diameter probes can cause shorts and mechanical difficulties in placing the probe tip on an integrated circuit lead. Thus the trend is toward long probe tips and tip leads that exhibit high stray capacitance. If left unshielded, these longer probe tips and tip leads result in high self inductance and both inductive and capacitive coupling to adjacent probe leads. These factors, combined with the increasingly high frequencies of electronic circuits, result in increased crosstalk and decreased signal fidelity. To combat crosstalk and allow faithful transmission of signals, shielding these long tips and tip leads is necessary. However, shielding increases stray capacitance between the tip lead and the shield. Thus there is a need for a electrical probe in which the stray capacitance, and therefore the input capacitance is reduced.

3. Solution to the Problem

The invention solves the above problem by incorporating the stray capacitance into the frequency compensation circuit.

The invention provides an intermediate or middle conductor between the probe input conductor and the shield conductor.

The middle conductor is very thin, preferably formed by a thin-film process. It has been found that the thinner the middle conductor the better, so long as the middle conductor is not so thin that its resistivity becomes a factor in the compensation circuit. The thinness of the middle conductor permits the probe tip according to the invention to be the same size as or only slightly larger than the conventional probe tip. Thus it can easily be adapted to miniaturization.

The capacitance between the middle conductor and the probe input conductor takes the place of the compensation capacitor, thus a compensation capacitor separate from the tip structure itself is no longer necessary, further contributing to miniaturization.

When implemented in the standard coaxial probe tip structure, the invention provides a triaxial probe tip. The invention may also be implemented in almost any other probe tip structure, such as in the flat probe tip structure used in multiple tip, flex circuit type probe leads.

The total input (or loading) capacitance of a probe having the probe tip according to the invention may be reduced by as much as 50% in comparison to the conventional probe. The possible reduction in capacitance is found to vary with the attenuation factor of the probe. For a probe with an attenuation factor of 10, the possible reduction is 34% and reaches 50% for an infinite attenuation factor.

SUMMARY OF THE INVENTION

The invention provides an electrical test probe comprising: a probe tip including: a probe input conductor, conductive shield means for shielding the probe input conductor; a

3 middle conductor located between the probe input conductor and the conductive shield means; dielectric means for insulating the middle conductor from the probe input conductor and the shield conductor; and a probe amplifier circuit electrically connected to the probe input conductor. Preferably, the middle conductor forms one electrode of an input compensation capacitor. Preferably, the probe input conductor forms the other electrode of the input compensation capacitor. Preferably, the probe input conductor comprises a cylindrical conductor, the conductive shield means comprises a hollow cylinder, and the middle conductor comprises a hollow cylinder. Preferably, the middle conductor comprises a thin film of conductive material formed on the dielectric means. Alternatively, the probe input conductor comprises a flat lead having a substantially rectangular cross-section, the middle conductor comprises a flat lead having a substantially rectangular cross-section, the conductive shield means comprises first and second shield leads located on opposite sides of the probe input conductor and having substantially rectangular cross-sections, and the middle conductor comprises a first middle conductor located between the first shield lead and the probe input conductor and a second middle conductor located between the second shield lead and the probe input conductor. Preferably, the middle conductor is formed along an equipotential surface defined between the probe input conductor and the shield conductor with the middle conductor not present.

In another aspect the invention provides an electrical test probe comprising: a probe input conductor adapted for contacting an electrical circuit under test, the probe input conductor having a capacitance associated with it; an amplifier circuit electrically connected to the input; and a frequency compensation circuit including at least a portion of the capacitance associated with the probe input conductor. Preferably, the test probe further includes a shield conductor shielding the probe input conductor, and the capacitance associated with the probe input conductor includes at least a portion of the capacitance between the shield and the probe input conductor. Preferably, the test probe further includes a middle conductor located between and insulated from the probe input conductor and the shield, and the frequency compensation circuit includes at least a portion of the capacitance between the middle conductor and the probe input conductor.

The invention also provides a method of forming an input compensation capacitor for an electrical test probe, the method comprising the steps of; providing a probe input conductor; shielding the probe input conductor with a shield conductor; and forming a middle conductor between the probe input conductor and the shield conductor. Preferably, the step of forming is performed between the step of providing and the step of shielding.

The invention not only provides a probe in which a larger portion of the probe tip can be compensated, but also results in a probe tip that is the same size as conventional probes. Numerous other features, objects and advantages of the invention will become apparent from the following description when read in conjunction with the accompanying drawings.

4

DESCRIPTION OF THE PREFERRED EMBODIMENT

1. Overview

Figure 1A:
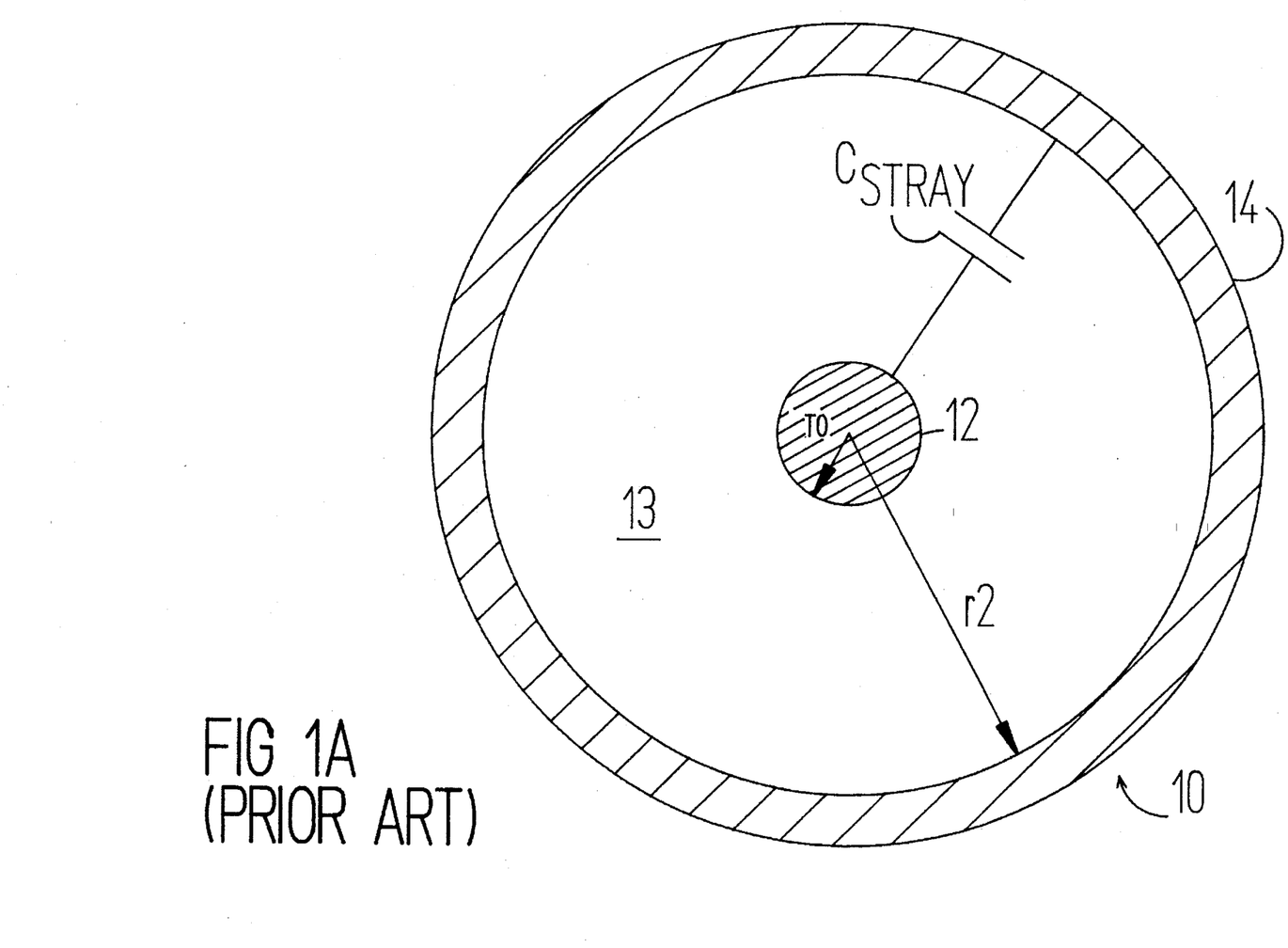
FIG. 1A is an illustration of a cross-section perpendicular to the axis of a conventional coaxial type probe tip, showing the stray capacitance of the tip.
Figure 1B:
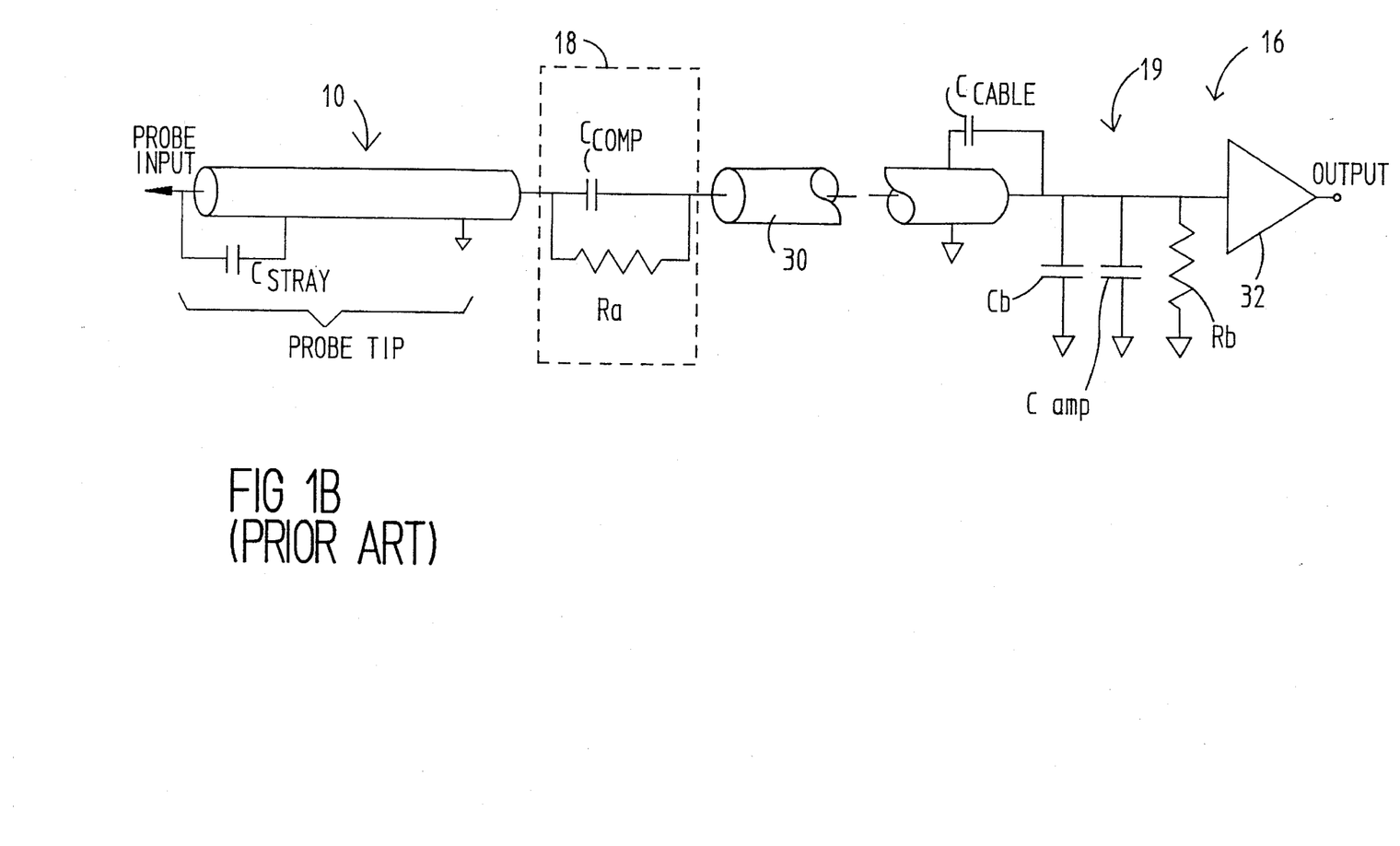
FIG. 1B is a circuit diagram of a conventional divider probe having the probe tip of FIG. 1A.
Figure 2A:
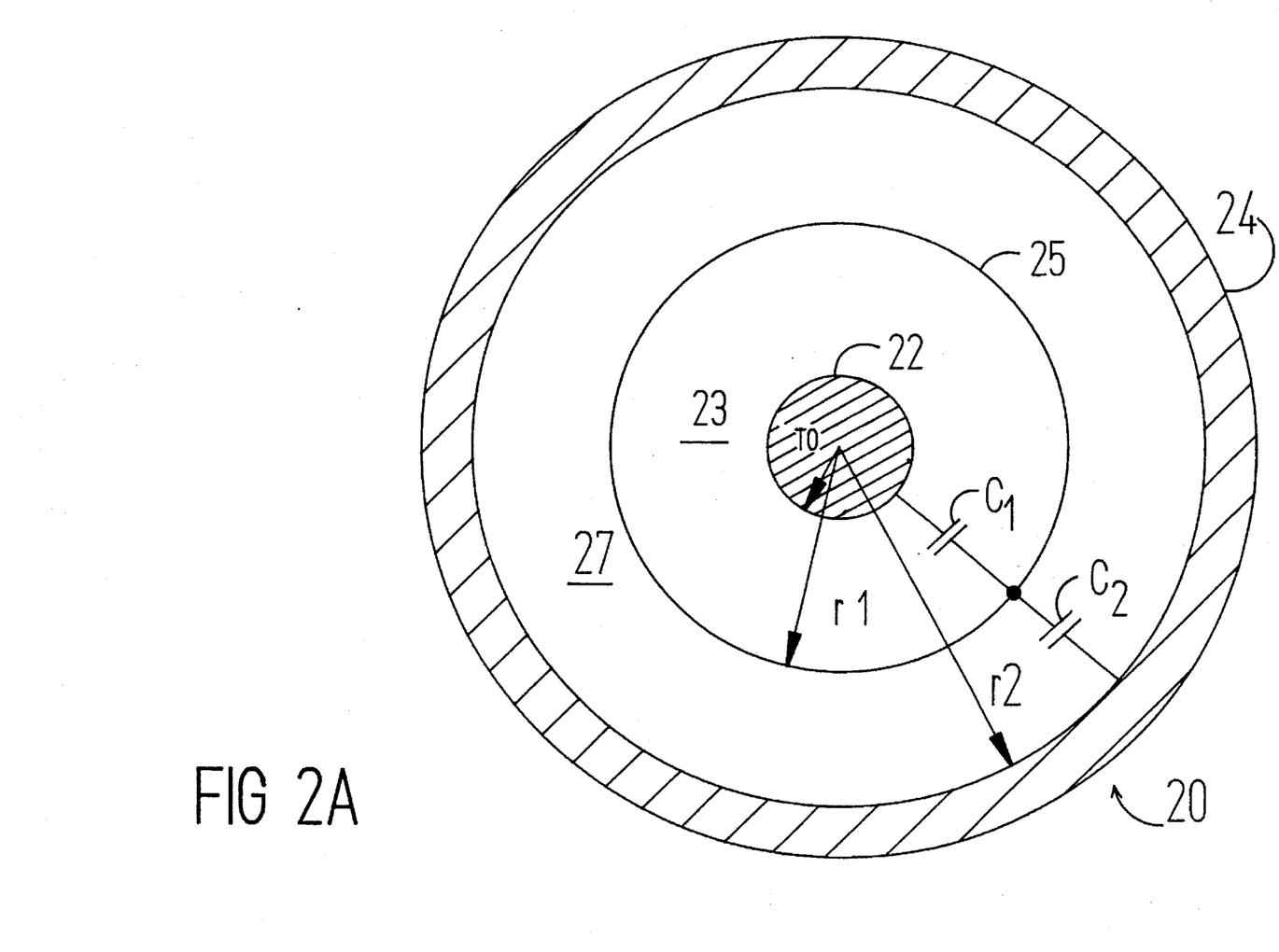
FIG. 2A is an illustration of a cross-section perpendicular to the axis of the preferred embodiment of a triaxial probe tip according to the invention.

FIG. 1A illustrates a cross-section perpendicular to the probe tip axis of a prior art probe tip 10, while FIG. 2A illustrates a cross-section perpendicular to the probe tip axis of a probe tip 20 according to the invention. It should be understood that the particular embodiments of the invention described herein are exemplary, and are described in detail to more clearly and fully depict the invention than would otherwise be possible; they are not meant to limit the invention to these particular embodiments. The prior art probe tip 10 includes a center probe input conductor 12 coaxial with a shield 14. There is stray capacitance between probe input conductor 12 and shield 14 which is indicated by the capacitor labeled Cstray. It is important to note that this capacitance, Cstray, is not a circuit component, but represents a capacitance in the element to which it is attached, and is shown only to establish notation. Likewise for other capacitances, such as Ccable, C1, and C2 introduced below. FIG. 1B shows a circuit diagram of a prior art divider probe circuit 16 having the probe tip 10. Circuit 16 includes frequency compensation circuit 18, which is located between the other circuitry 19 of the probe and the probe tip 10. This circuit structure leaves the capacitance of the tip 10, i.e. Cstray, directly exposed to the circuit under test, so that its loading effect is not reduced by the attenuation factor.

Figure 2B:
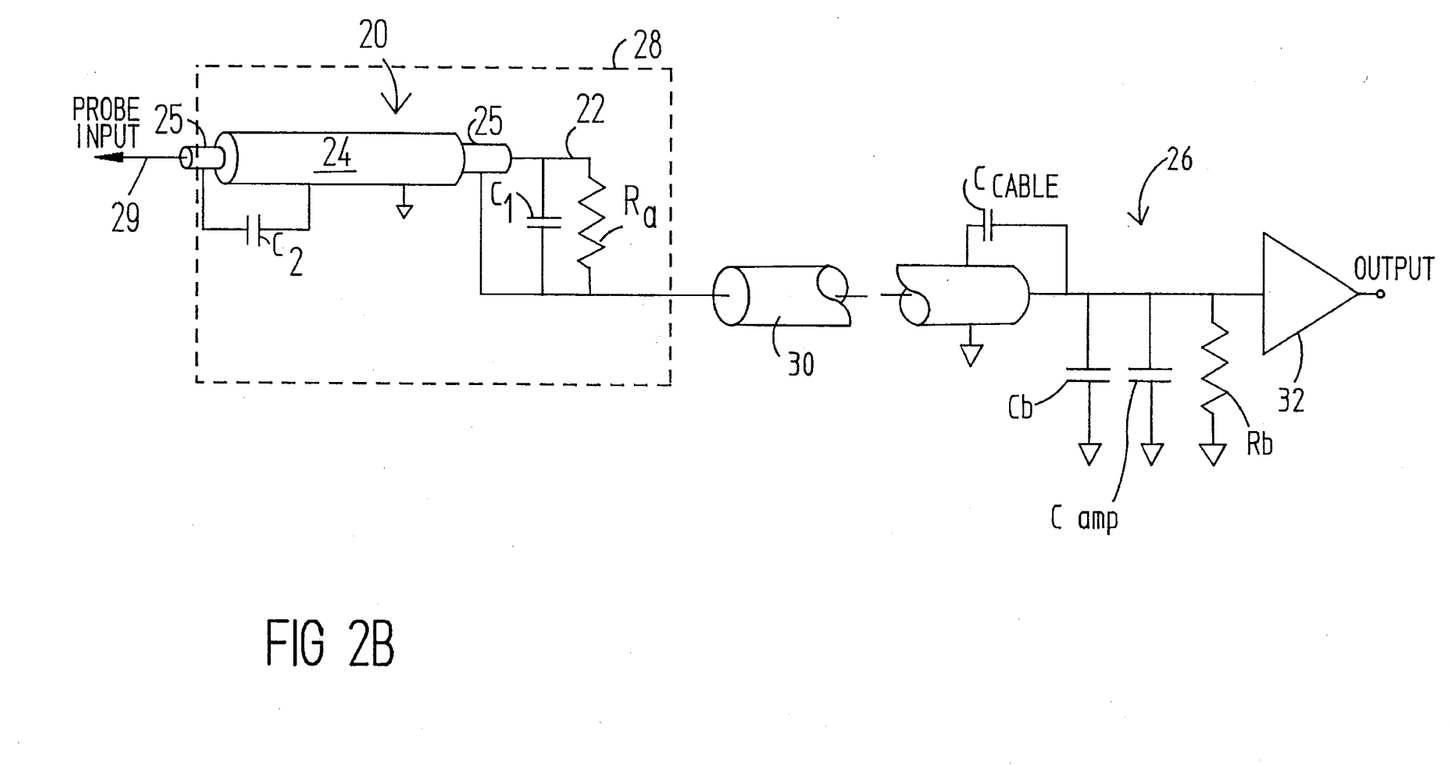
FIG. 2B is a circuit diagram of a probe having the probe tip of FIG. 2A.

The probe tip 20 according to the invention includes a probe input conductor 22, an outer shield 24, and a middle conductor 25. The capacitance between the middle conductor 25 and the probe input conductor 22 is indicated by the capacitor labeled C1 and the capacitance between the outer shield 24 and the middle conductor 25 is indicated by the capacitor labeled C2. FIG. 2B shows a circuit diagram of a probe circuit 26 according to the invention having the probe tip 20 of FIG. 2A. The probe circuit 26 according to the invention is chosen to be identical to the probe circuit 16 of the prior art except for the addition of the middle conductor 25 and the change in the compensation circuit 28. The identical symbols, such as Ccable, Cb, Camp, Ra, Rb, and Cx are used in describing the probe capacitance and resistance values and identical numbers are used to indicate that cable 30 and amplifier 32 are identical in the probe circuit 26 according to the invention; the identity of these values and components and the identical notation permits the probe according to the invention to be compared more easily to the prior art probe. In the probe according to the invention, the capacitance C1 forms part of a frequency compensation circuit 28 which compensates for all potentially band width limiting capacitances, including Cx, Ccable, Cb, and Camp. A small capacitance between the end 29 of the input conductor 22 and the shield 24 remains on the distal side of the frequency compensation circuit 28. This capacitance is much less than Cstray in the prior art probes; it cannot be reduced by the attenuator.

2. Details of the Prior Art Probe Circuit

Referring to FIG. 1A, the prior art coaxial probe tip structure includes an inner solid, cylindrical probe input conductor 12, a cylindrical insulating sheath 13, and a cylindrical conducting shield 14. A generalized prior art probe circuit 16 is shown in FIG. 1B. Circuit 16 includes the probe tip 10, frequency compensation circuit 18, a probe cable 30 and an amplifier circuit 32. "Amplifier" is used here in the most general sense to include circuits that may increase, decrease, or pass through a signal without change; or it may be a circuit that changes the form of the signal, such as a voltage comparator that changes an incoming analog signal to digital form. The amplifier 32 and the associated capacitance and resistance may be part of the test instrument. Each of the parts of the circuit have inherent capacitance to nearby components, such as the grounded tip and cable shields, which is illustrated in the drawing. The capacitance of the probe tip to the shield is indicated by the capacitor Cstray. The cable has capacitance indicated by the capacitor Ccable, and the amplifier has capacitance indicated by the capacitor Camp. The frequency compensation circuit includes resistance Ra and capacitor Ccomp. The probe circuit also includes capacitor Cb and resistor Rb. Both capacitors Ccomp and Cb will generally be adjustable in some manner, and may be variable capacitors. Their value is selected to tune the circuit 16 to have constant attenuation for all frequencies of interest. Resistors Ra and Rb form a resistive voltage divider network, and Ccomp, Cb, Ccable and Camp form a capacitive voltage divider network. The input compensation circuit 18 adjusts the circuit so the test circuit (not shown), which would be to the left of the compensation circuit 18 sees the capacitance to the right of the input compensation network, which includes most of the capacitance in the circuit 16, reduced by the attenuation factor. However, there is a component of probe capacitance, indicated by Cstray, which the test circuit sees directly. The loading effects of Cstray on the test circuit are not reduced by the attenuation factor.

Figure 1C:
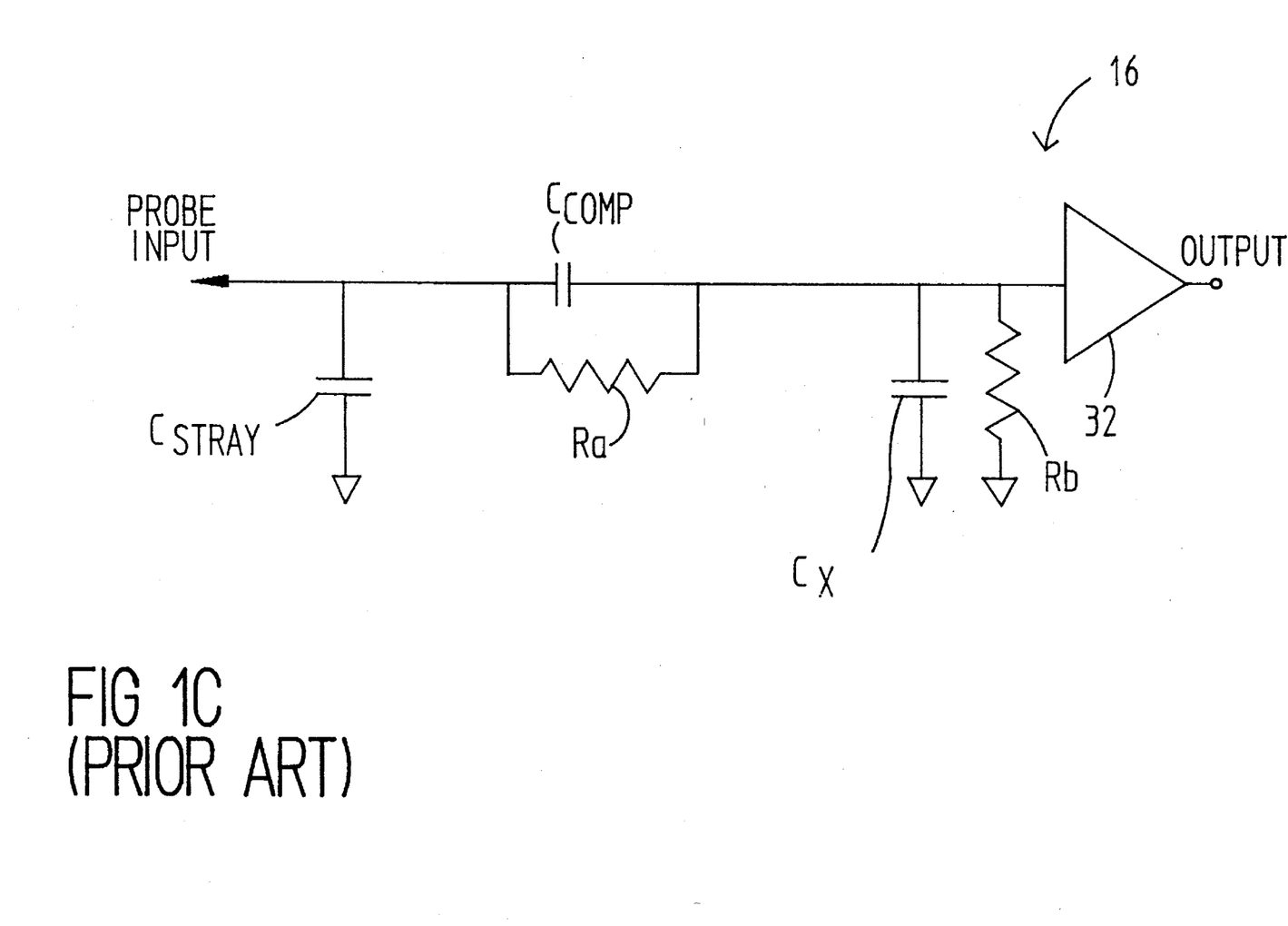
FIG. 1C is an equivalent circuit to the circuit of FIG. 1B.

FIG. 1C shows an equivalent circuit to the circuit of FIG. 1B. As can be seen by comparing the figures:

$$Cx = Ccable + Cb + Camp. \quad (1)$$

The input frequency compensation adjustment is a high frequency adjustment, since that is the region where the capacitance of the circuit has the most effect on the response. At high frequencies the effect of the resistors Ra and Rb is negligible. Straight-forward circuit analysis of FIG. 1C shows that the gain, A, of the divider probe circuit 16 at high frequencies is given by:

$$A = Ccomp/(Ccomp + Cx) \quad (2),$$

and the input capacitance for the conventional coaxial probe circuit 16 of FIG. 1C, Cin(conv), is:

$$Cin \ (conv) = Cstray + (Ccomp^{-1} + Cx^{-1})^{-1} \quad (3).$$

Using algebra we see that:

$$(Ccomp^{-1} + Cx^{-1})^{-1} = Ccomp Cx/(Ccomp + Cx) = ACx \quad (4).$$

Therefore, using equations 3 and 4 we get:

$$Cin(conv) = Cstray + ACx \quad (5).$$

Equation 5 will be used below to compare the input capacitance of the conventional prior art probe circuit 16, having the prior art coaxial probe tip 10, with the probe circuit 26 having the triaxial probe tip 20 according to the invention.

3. Details of the Probe Circuit of the Invention

FIG. 2A illustrates a cross-sectional view of a probe tip 20 according to the invention. Probe tip 20 includes a solid cylindrical probe input conductor 22, outer cylindrical conductive shield 24, inner cylindrical insulative sheath 23, middle cylindrical conductor 25, and outer insulative sheath 27 between middle conductor 25 and outer conductor 24. Preferably, the input conductor 22, the middle conductor 25, and the shield conductor 24 are concentric. It is a feature of the invention that the middle conductor 25 forms one electrode of a frequency compensation capacitor C1, with the input conductor 22 forming the other electrode of the capacitor. Further middle conductor 25 forms one electrode of capacitor C2, while shield 24 forms the other electrode of the capacitor C2. The capacitance between the middle conductor 25 and the probe input conductor 22 is indicated by the capacitor labeled C1 and the capacitance between the outer shield 24 and the middle conductor 25 is indicated by the capacitor labeled C2.

Figure 4:
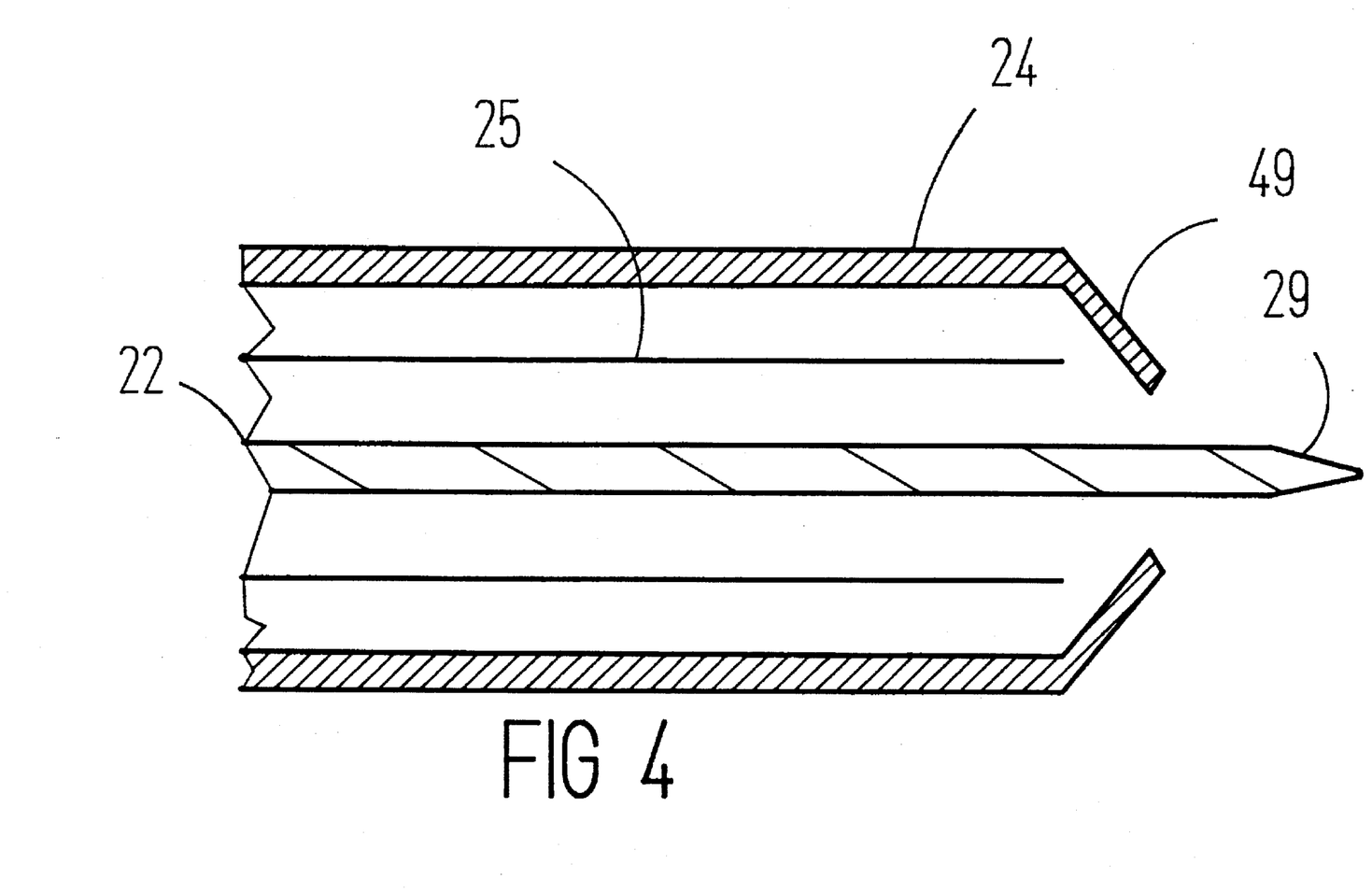
FIG. 4 is an illustration of a cross-section through the axis of a probe tip in the preferred embodiment of the invention showing how the outer shield conductor shields the middle conductor.

Preferably, middle conductor 25 is very thin, of the order of 10% of $r_2 - r_0$ or less, and is formed along an equipotential surface as defined by the electrical field between probe input conductor 22 and shield 24 when middle conductor 25 is not present. Such an equipotential surface can be determined by applying a static potential between the input conductor 12 (FIG. 1A) and the shield conductor 14 when no middle conductor is present. The electric field thus established defines infinitely many equipotential surfaces between the two conductors. One can minimize the total input capacitance by locating the middle conductor on the equipotential surface that introduces just enough capacitance between the input and the middle conductors to properly compensate the capacitance Cb, the capacitance of the cable and amplifier, and the additional capacitance introduced between the middle conductor and the shield. The desirable radius $r_1$ for the middle conductor can be found through mathematical analysis, and is given by equation 16 below. Probe input conductor 22 and shield 24 are the same or about the same size as they are in the prior art probe tip 10. The probe input conductor 22, shield 24, and insulative layers 23 and 27 may be made of the same materials and formed similarly to the analogous parts in the prior art probe tip 10, that is probe input conductor 22 and shield 24 are made of a strong, conductive brass or beryllium copper, and insulators 23 and 17 are made of an insulative plastic such as teflon. Middle conductor 25 is made of a highly conducting material such as gold, aluminum, or copper. Middle conductor 25 should be as thin as possible, providing that its resistance does not become so high as to limit the bandwidth of the probe. Preferably it is metal vapor deposited, though it may be plated, sputtered, applied by doping with another material to make it conductive, or formed by any other suitable process for making a thin electrically conductive film. Alternatively, the middle conductor 25 could be made with low conductivity material so that it would tend to absorb reflected waves or signals in the probe tip 20 and/or the probe cable 30. The same is true for the cable 30 or the input conductor 22. In FIG. 2B middle conductor 25 and probe input conductor 22 are shown extending from the shield 24 on each end to more clearly depict the parts; however, preferably only the probe input conductor will extend from the shield near the tip end 29 as shown in FIG. 4. It is undesirable that the middle conductor touch any portion of the circuit under test or be exposed to capacitive coupling with the circuit under test, therefore the shield 24 is preferably tapered inward at the distal end 49 to shield the middle conductor 25. The end 29 of probe input conductor 22 extends out beyond the end 49 of the shield 24 in order to contact the node to be tested. Preferably, the size of insulator 23 on which middle conductor 22 is deposited is selected so that C1 is higher than will produce the specified frequency compensation of the circuit 26. Insulator 27 initially does not cover a portion of middle conductor 25 at the right end of probe tip 20 in FIG. 2B. Middle conductor 25 is then laser trimmed to adjust the input compensation to specification. Shield 24 may also be trimmed if desired or needed. Alternatively, the middle conductor can be threaded so that by turning it, it slides in and out of the probe tip adjusting the frequency compensation. The benefits of the invention are maximized when C1 is just large enough to compensate C2, Ccable, Camp, and Cb. The entire probe tip 20, except the ends 29 and 49, is then covered with a conventional protective plastic.

FIG. 2B shows a circuit diagram of a probe circuit 26 according to the invention having the probe tip 20 of FIG. 2A. Circuit 26 includes the probe tip 20, frequency compensation circuit 28, probe cable 30 and amplifier circuit 32. "Amplifier" is again used in the most general sense to include circuits that may increase, decrease, or pass through a signal without change, or be a comparator or other device where the gain is highly non-linear. The amplifier 32 and its associated capacitance and resistance may be part of the test instrument. Each of the parts of the circuit have inherent capacitance to nearby components, such as the grounded tip and cable shields, which is illustrated in FIG. 2B. The capacitance of the probe tip is divided into the capacitances C1 and C2 defined above. The cable has capacitance indicated by the capacitor Ccable, and the amplifier has capacitance indicated by the capacitor Camp. The frequency compensation circuit includes resistance Ra and capacitors C1 and C2. The probe circuit also includes capacitor Cb and resistor Rb. Capacitances C1 and C2 and Cb will generally be adjustable in some manner, and may be considered as variable capacitors. Their value is selected to tune the circuit 26 to have constant attenuation for all frequencies of interest. Resistors Ra and Rb form a resistive voltage divider network, and C1, C2, Cb, Ccable, and Camp form a capacitive voltage divider network. The input compensation circuit 28 adjusts the circuit so the test circuit (not shown), which would be to the left of the compensation circuit 28 sees the capacitance to the right and below of the input compensation network, which includes C2 and most of the capacitance in the circuit 26, reduced by the attenuation factor. However, there is a component of probe capacitance, which the test circuit sees directly, i.e., the capacitance of a small part of the shield 24 and probe input conductor 25 that extend beyond the middle conductor 25 (FIG. 4). This capacitance is much less than the overall input capacitance. The loading effects of this capacitance on the test circuit are not reduced by the attenuation factor.

To see how the middle conductor 25 affects the input capacitance, we first note that for coaxial cylinders of length l, the capacitance from a cylinder of radius $r_x$ to a concentric cylinder of radius $r_y$ is:

$$Cxy = 2\Pi\epsilon l / \ln(r_y/r_x) \qquad (6),$$

where $\epsilon$ is the dielectric constant of the dielectric between the cylinders and $r_y > r_x$. Referring to FIG. 2A, C1 is the capacitance between a cylinder of radius $r_0$ and a cylinder of radius $r_1$, and C2 is the capacitance between a cylinder of radius $r_1$ and a cylinder of radius $r_2$. The thickness of the middle conductor is assumed negligible. Therefore using equation 6 we get:

$$\begin{aligned}(C1^{-1} + C2^{-1})^{-1} &= [\ln(r_1/r_0)/(2\Pi\epsilon l) + \ln(r_2/r_1)/(2\Pi\epsilon l)]^{-1} \\ &= 2\Pi\epsilon l[\ln(r_1/r_0 \times r_2/r_1)]^{-1} \\ &= 2\Pi\epsilon l/\ln(r_2/r_0),\end{aligned} \qquad (7)$$

which is the capacitance between concentric cylinders of radius $r_2$ and radius $r_0$, which, as we see from FIG. 1A, is Cstray for a conventional probe tip of length l. Therefore, $$(C1^{-1} + C2^{-1})^{-1} = Cstray \qquad (8)$$

Applying algebra to equation 8 we get:

$$C1 = (Cstray^{-1} - C2^{-1})^{-1} \qquad (9)$$

Figure 2C:
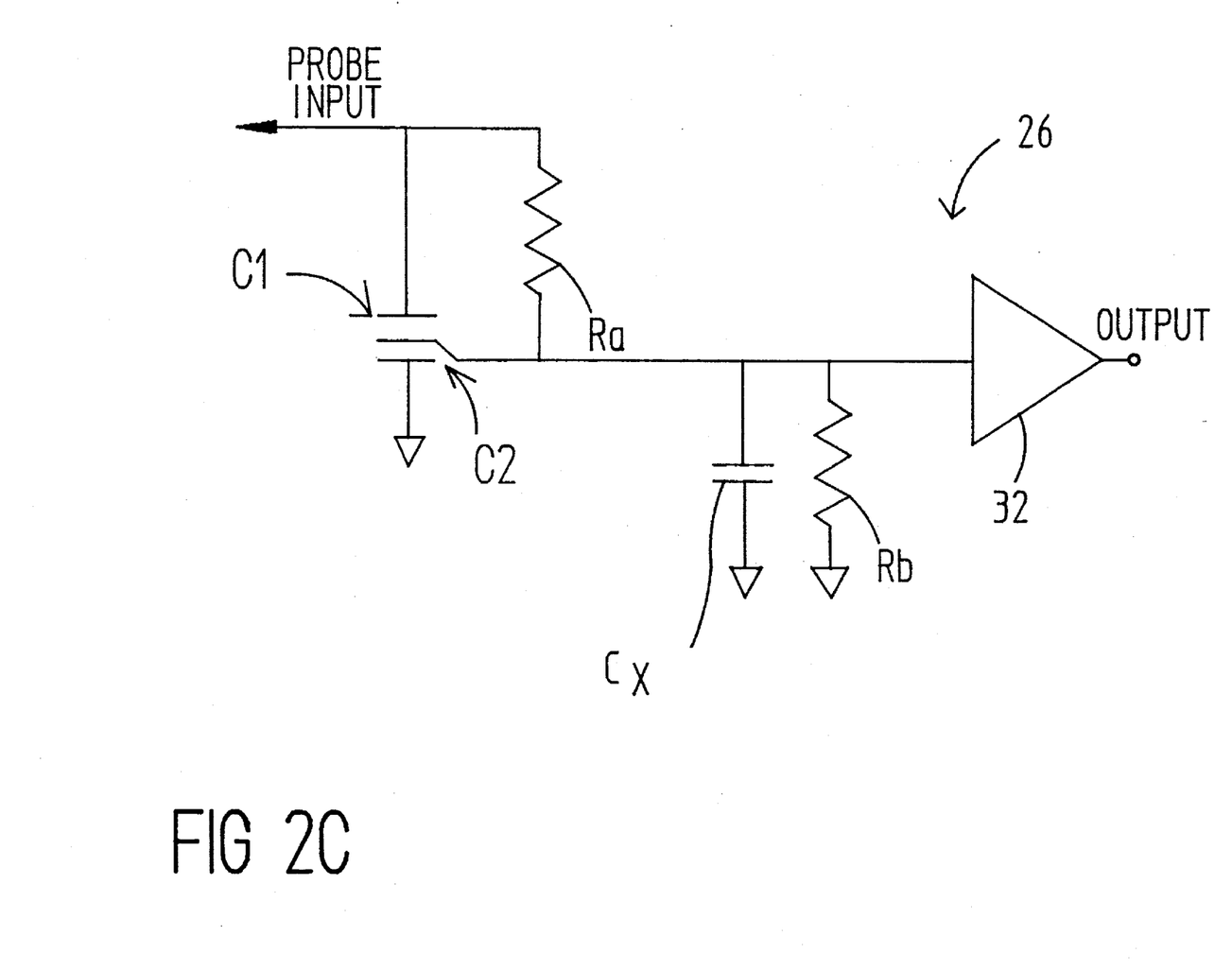
FIG. 2C is an equivalent circuit to the circuit of FIG. 2B.

From elementary circuit analysis, we find that the input capacitance for the triaxial probe circuit 26 of FIG. 2C, Cin(triax) is:

$$\begin{aligned}Cin(triax) &= A(C2 + Cx) \\ &= (1 - A)C1,\end{aligned} \qquad (10)$$

where A is the gain of the attenuator and is given by:

$$A = C1/(C2 + Cx + C1) \qquad (11)$$

Inserting equation 9 in equation 10, we get:

$$A(C2 + Cx) = (1 - A)(Cstray^{-1} - C2^{-1})^{-1}. \qquad (12)$$

Applying algebra to equation 12, we get:

$$C2^2 - C2Cstray(1/A - CxCstray^{-1}) - CxCstray = 0. \qquad (13)$$

Solving the quadratic equation 13 for C2 we obtain:

$$C2 = 1/2[(Cstray/A - Cx) + \{(Cstray/A - Cx)^2 + 4CxCstray\}^{1/2}], \qquad (14)$$

where we have selected the positive solution since C2 is a physical capacitor and therefore is always positive. Combining equations 10 and 14 we obtain:

$$Cin(triax) = ACstray\{Cx/Cstray + 1/2[(1/A - Cx/Cstray) + \{(1/A - Cx/Cstray)^2 + 4Cx/Cstray\}^{1/2}]\}. \qquad (15)$$

Figure 3:
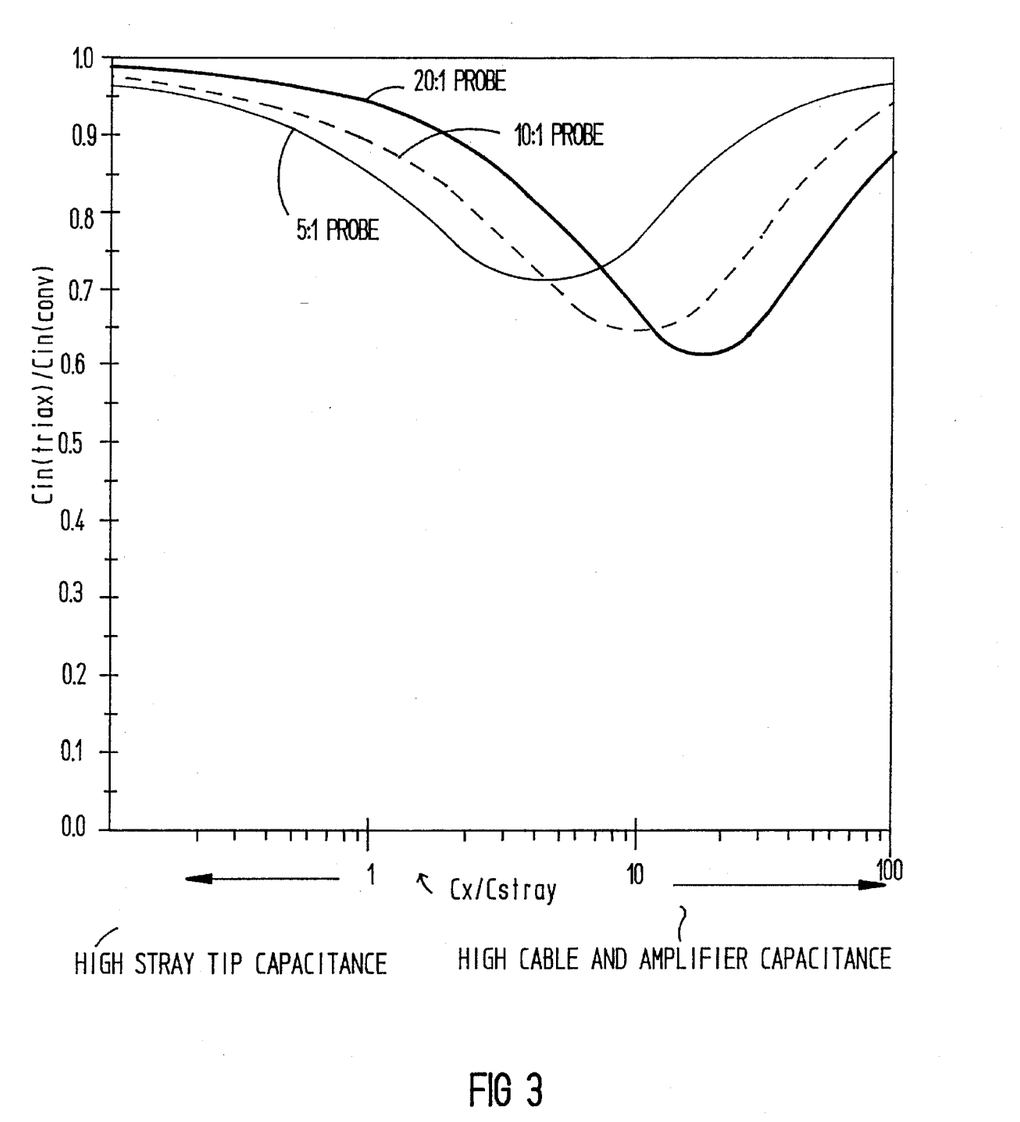
FIG. 3 is a graph showing the reduction of total input capacitance for various probes having different attenuation factors.

The ratio Cin(triax)/Cin(conv) can be found by dividing equation 15 by equation 5. This ratio permits us to examine how introduction of the middle conductor reduces the capacitance of a probe according to the invention in comparison to a prior art probe that is otherwise identical. The ratio Cin(triax)/Cin(conv) is plotted as a function of Cx/Cstray in FIG. 3. Cx/Cstray is the ratio of the compensated capacitance in the conventional probe to the stray capacitance in the conventional probe. It is also a measure of how the capacitance of the cable and amplifier, which is included in Cx, compares with the capacitance of the probe tip. Thus values when Cstray is large compared to Cx (or when the stray capacitance of the tip dominates the input capacitance) lie to the left in the graph, while values when Cx is large compared to Cstray, that is when the cable and amplifier capacitance dominates, lie to the right of the graph. Curves are shown for different values of A, i.e., for different attenuation factors. The graph shows that Cin(triax) is always less than Cin(conv). There is a minimum point for each curve. Analysis shows that the minimum occurs when Cx/Cstray=1/A. For a typical probe, such as a probe with attenuation of 10, the minimum is at Cin(triax)/Cin(conv)= 0.66, or the invention reduces the input capacitance by as much as 34% for a 10:1 probe. As the attenuation of the probe increases, the minimum decreases. It reaches a minimum of 50% for an infinite probe, that is for a probe with ∞:1 attenuation and with Cx/Cstray=∞. It should be understood that the graph of FIG. 3 is only an approximation to the actual performance of the invention, since a number of approximations were made in arriving at it. For example, equation 6 and the equations that depend on it assume that the end effects of the cylinders are small. However, for a probe of typical parameters, the approximations made are valid.

Using equations 6 and 11 above, we can find the diameter of the middle conductor 25 in the triaxial probe such that the total input capacitance is minimized. This is given by:

$$A=[1+ln(r_1/r_0)/ln(r_2/r_1) +Cxln(r_1/r_0)/2\Pi\epsilon l]^{-1}, \quad (16)$$

where A is the desired attenuation. In equation 16, $r_0$, $r_2$, and $l$ are fixed by mechanical design constraints, and Cx is determined by the cable and/or amplifier. Thus the equation can be solved for $r_1$, the radius of the middle conductor 25 which will minimize the total capacitance. There is probably no analytical solution for equation 16, however, it can be solved by numerical techniques with little difficulty.

Figure 5A:
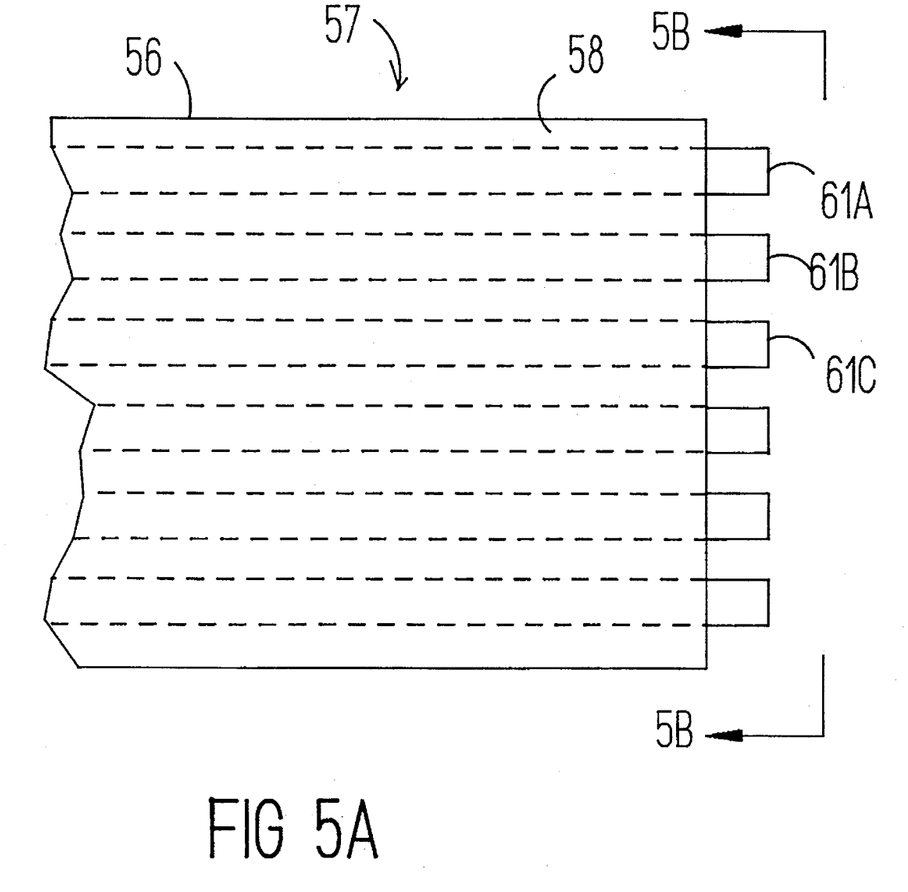
FIG. 5A is a plane view of the probe tip portion of a flex circuit type multiple-tip probe lead.
Figure 5B:
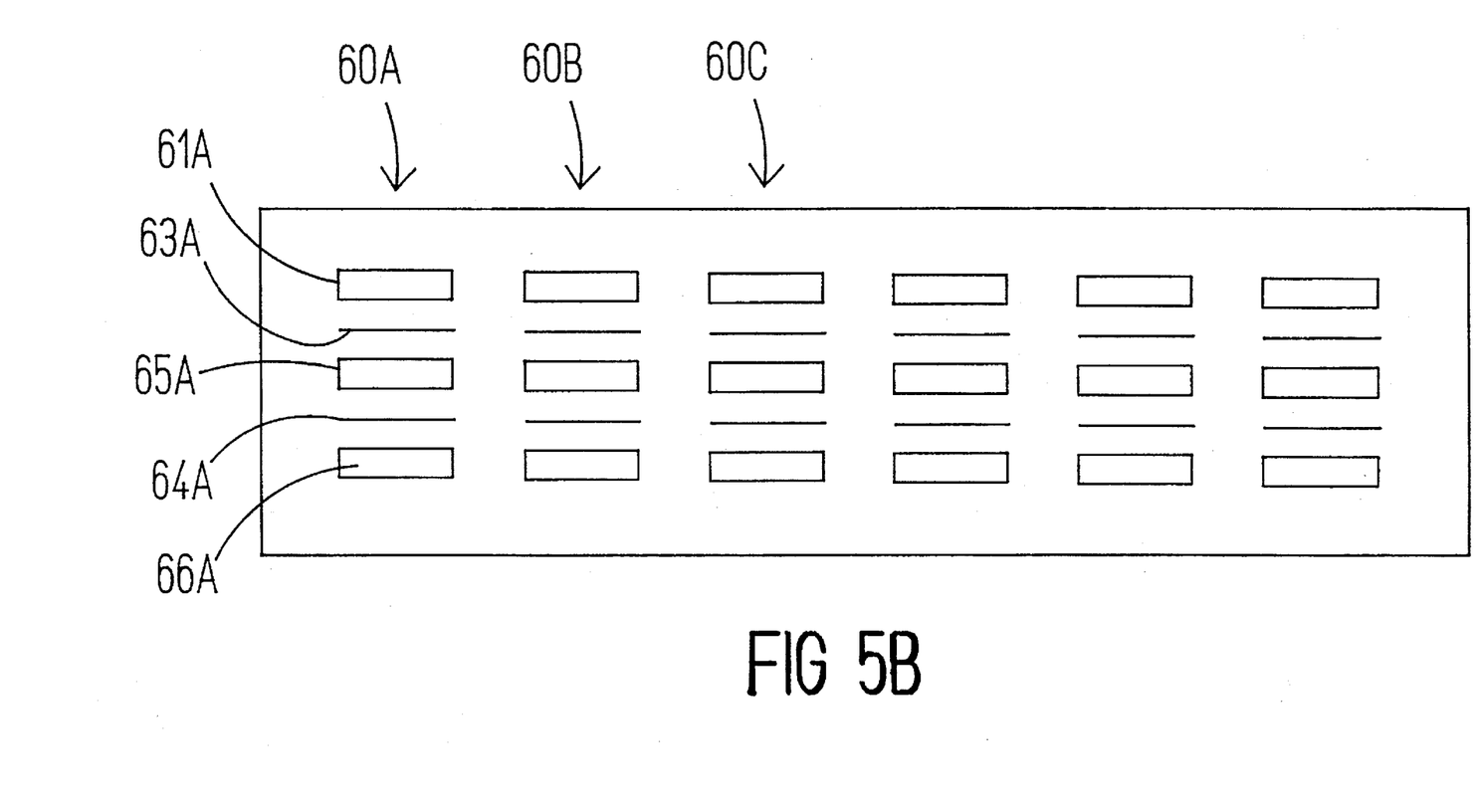
FIG. 5B is a frontal view of the probe lead of FIG. 5A viewed in the direction 5B—5B indicated in FIG. 5A.

FIGS. 5A and 5B show an alternative embodiment of the invention. This embodiment is one in which the probe tip is implemented in a flex circuit 56. The flex circuit includes a plurality of traces 57, shown by dotted lines, in a flexible plastic envelope 58. There are a plurality of probe tips 60A, 60B, 60C etc. Each probe tip, such as 60A, includes a probe input conductor 65A, a pair of outer shield conductors 61A and 66A, and a pair of middle conductors 63A and 64A which are between the outer shield conductors 61A and 66A, respectively, and the probe input conductor 65A. Each of the conductors, 61A, 66A, 63A, 64A, and 65A is a flat lead having a substantially rectangular cross-section. Other embodiments are possible. For example, if there is only one shield conductor 61A for each probe input conductor 65A, then there would only be one middle conductor 63A which would be inserted between the single shield 61A and the probe input conductor 65A.

It is a feature of the invention that at least a portion of the stray capacitance of the prior art probes now serves to couple the signal into the cable 30 and amplifier 32. The capacitance C2 between the middle conductor and the shield is placed in parallel with the cable, and, when referred to the probe tip 20, is reduced by the attenuation factor A. In effect, the tip capacitance, which performs no useful function in the conventional probe, has been employed as the compensation capacitor.

Another feature of the invention is that the input capacitance is decreased without increasing the size of the probe tip. The relatively bulky compensation capacitor of the prior art has been incorporated into the probe structure. However, it should be understood that a compensation capacitor in addition to the capacitor formed between the probe input conductor 22 and the middle conductor 25 can be used within the probe according to the invention. The important point is that a capacitor is created using the middle conductor that can be used in the compensation circuit in lieu of at least some of the capacitance in that circuit.

A further feature of the invention is that it can be applied to any type of probe. For example, the middle conductor may also be used in active probes, or with AC coupled probes. In the latter case the capacitance between the middle conductor and input conductor becomes one of the capacitors in a capacitive voltage divider.

There has been described a novel test probe that incorporates the probe tip structure into the compensation circuit, and has many other advantages. It should be understood that the particular embodiment shown in the drawings and described within this specification is for purposes of example and should not be construed to limit the invention which will be described in the claims below. Further, it is evident that those skilled in the art may now make numerous uses and modifications of the specific embodiments described, without departing from the inventive concepts. For example, now that it is seen to be advantageous to provide a middle conductor in the coaxial probe tip structure and the rectangular flex circuit probe tip structure, it is evident that the principle of the invention can be applied to many other probe configurations. The invention may also be applied to other types of circuits than that described. Or equivalent components or circuits can be substituted for the various components and circuits described. Additional features may be added. A greater or lesser number of parts may be used. Consequently, the invention is to be construed as embracing each and every novel feature and novel combination of features present in and/or possessed by the electrical test probe described.

What is claimed is:

1. An electrical test probe comprising:
    a probe tip including: a probe input conductor, conductive shield means for shielding said probe input conductor; a middle conductor having a preselected thickness and shape such that it is substantially located on an equipotential surface between said probe input conductor and said conductive shield means, wherein said equipotential surface is defined by an electrical field between said probe input conductor and said conductive shield means in the absence of the middle conductor; dielectric means for insulating said middle conductor from said probe input conductor and said conductive shield means;
    a probe amplifier circuit having an input electrically coupled to said probe input conductor and to said middle conductor; and
    a frequency compensation capacitor having a first electrode formed by said middle conductor and having a second conductor formed by said probe input conductor.

2. A test probe as in claim 1 wherein said predetermined thickness of said middle conductor is less than ten percent of the distance between said input conductor and said conductive shield means.

3. A test probe as in claim 2 wherein said middle conductor is formed by metal vapor deposition.

4. A test probe as in claim 1 wherein the probe input conductor, the middle conductor, and the conductive shield means are arranged such that an effective input capacitance formed by an electrical combination of a i) probe input conductor-to-middle conductor capacitance a ii) middle conductor-to-shield means capacitance and a iii) probe input conductor-to-shield means capacitance is less than a capacitance of the input conductor-to-shield means in the absence of the middle conductor.

5. A test probe as in claim 1 wherein said conductive shield means comprises a hollow cylinder coaxially aligned with said middle conductor and that is tapered inwardly towards said probe input conductor near a tip of said test probe thereby preventing capacitive coupling between said middle conductor and a circuit under test.

6. A test probe as in claim 5 wherein said conductive shield means, said probe input conductor, and said middle conductor comprise cylinders of substantially identical length.

7. A test probe as in claim 1 wherein said probe input conductor comprises a flat lead having a substantially rectangular cross-section.

8. A test probe as in claim 7 wherein said middle conductor comprises a flat lead having a substantially rectangular cross-section.

9. A test probe as in claim 7 wherein said conductive shield means comprises first and second shield leads located on opposite sides of said probe input conductor and having substantially rectangular cross-sections.

10. A test probe as in claim 9 wherein said middle conductor comprises a first middle conductor located between said first shield lead and said probe input conductor and a second middle conductor located between said second shield lead and said probe input conductor.

11. An electrical test probe comprising:

a probe tip including: a probe input conductor, conductive shield means for shielding said probe input conductor; a middle conductor having a preselected thickness and shape such that it is substantially located on an equipotential surface between said probe input conductor and said conductive shield means, wherein said equipotential surface is defined by an electrical field between said probe input conductor and said conductive shield means in the absence of the middle conductor; dielectric means for insulating said middle conductor from said probe input conductor and said conductive shield means, wherein said middle conductor comprises a thin film of conductive material formed on said dielectric means;

a probe amplifier circuit having an input electrically coupled to said probe input conductor and to said middle conductor; and a frequency compensation capacitor having a first electrode formed by said middle conductor and having a second conductor formed by said probe input conductor.

12. An electrical test probe comprising:

a probe tip including: a probe input conductor, conductive shield means for shielding said probe input conductor; a middle conductor having a preselected thickness and shape such that it is substantially located on an equipotential surface between said probe input conductor and said conductive shield means, wherein said equipotential surface is defined by an electrical field between said probe input conductor and said conductive shield means in the absence of the middle conductor; dielectric means for insulating said middle conductor from said probe input conductor and said conductive shield means;

a probe amplifier circuit having an input electrically coupled to said probe input conductor and to said middle conductor, wherein said probe amplifier circuit has a capacitance $C_x$ and said test probe an attenuation factor A, said test probe has a length (l) said probe input conductor has a radius $r_0$, said shield means is located at a radius $r_2$ from said probe input conductor, and said equipotential surface is located at a distance $r_1$ from said probe input conductor where $r_1$ is selected to satisfy the equation $$A=[1+ln(r_1/r_0)/ln(r_2/r_1)+(C_x)ln(r_1/r_0)/2\pi\epsilon\, 1]^{-1};$$

and a frequency compensation capacitor having a first electrode formed by said middle conductor and having a second conductor formed by said probe input conductor.

13. A method of forming a frequency compensation capacitor for an electrical test probe, said method comprising the steps of;

providing a probe input conductor having a first end near a tip of the electrical test probe and a second end for coupling to a test instrument, said probe input conductor being highly conductive from said first end to said second end;

shielding said probe input conductor with a shield conductor; and forming a middle conductor between said probe input conductor and said shield conductor so that the middle conductor is insulatingly spaced from the input conductor from said first end to said second end, a portion of said middle conductor near said second end being adapted to couple to said test instrument, said middle conductor having a preselected thickness and shape such that it is substantially located on an equipotential surface defined by the electrical field between said probe input conductor and said shield conductor.

14. A method as in claim 13 wherein said step of forming is performed between said step of providing and said step of shielding.

15. An electrical test probe comprising:

a probe input conductor having a first end for probing a circuit under test, and a second end for coupling to a probe amplifier circuit;

a first insulating plastic layer having a first thickness covering the probe input conductor and having a length extending from the second end towards the first end of the probe input conductor, wherein the first end of the probe input conductor extends beyond the first insulating plastic layer;

a thin film middle conductor formed on the first insulating plastic layer extending along the length of the first insulating plastic layer over the second end of the probe input conductor and having a portion near the second end for coupling to a probe amplifier circuit;

a second insulating plastic layer having a second thickness covering the thin film middle conductor;

conductive shield means formed on the second insulating plastic layer for shielding said probe input conductor such that the thin film middle conductor is located between the probe input conductor and the conductive shield means along the length of the first insulating plastic layer, the thin film middle conductor having a preselected thickness and shape such that it is substantially located on a equipotential surface defined by the electrical field between the probe input conductor and the conductive shield means.

16. The electrical test probe of claim 15 wherein the probe input conductor is highly conductive from the first end to the second end.

17. The electrical test probe of claim 15 wherein a portion of the thin film middle conductor over the second end of the probe input conductor is laser trimmed.

18. The electrical test probe of claim 15 wherein the thin film middle conductor has a thickness less than ten percent of the distance from the probe input conductor to the conductive shield means.

* * * * *